US006529993B1

(12) United States Patent
Rogers et al.

(10) Patent No.: US 6,529,993 B1
(45) Date of Patent: Mar. 4, 2003

(54) DATA AND DATA STROBE CIRCUITS AND OPERATING PROTOCOL FOR DOUBLE DATA RATE MEMORIES

(75) Inventors: Jim L. Rogers, Milton, VT (US); Timothy E. Fiscus, South Burlington, VT (US)

(73) Assignee: International Business Machines Corp., Armonk, NY (US)

( * ) Notice: Subject to any disclaimer, the term of this patent is extended or adjusted under 35 U.S.C. 154(b) by 313 days.

(21) Appl. No.: 09/689,090

(22) Filed: Oct. 12, 2000

(51) Int. Cl.$^7$ ............................................... G06F 12/00
(52) U.S. Cl. ................... 711/105; 365/189.01; 365/193
(58) Field of Search ................................ 711/100, 104, 711/105; 365/189.01, 189.04, 189.05, 191, 193

(56) References Cited

U.S. PATENT DOCUMENTS

| | | | |
|---|---|---|---|
| 4,644,185 A | | 2/1987 | Toidd |
| 4,712,190 A | | 12/1987 | Guglielmi eta l. |
| 5,258,952 A | | 11/1993 | Coker et al. |
| 5,550,533 A | | 8/1996 | Pawlowski |
| 5,877,987 A | | 3/1999 | Merritt |
| 5,940,337 A | | 8/1999 | Jiang |
| 5,949,721 A | | 9/1999 | Park |
| 6,081,477 A | * | 6/2000 | Li .......................... 365/189.05 |
| 6,198,674 B1 | * | 3/2001 | Kim ............................ 365/193 |
| 6,279,073 B1 | * | 8/2001 | McCracken et al. ......... 711/105 |

OTHER PUBLICATIONS

Gabara et al. High Speed Digital Circuit Techniques, Feb. 17, 1988, 1988 IEEE International Solid State Circuits Conference.

* cited by examiner

Primary Examiner—Kevin L. Ellis
Assistant Examiner—Zhuo H. Li
(74) Attorney, Agent, or Firm—Francis J. Thornton; Robert A. Walsh

(57) ABSTRACT

This is a circuit and protocol for relaxing the strobe to data relationship to permit the writing into and reading out of a double data rate DRAM array at data transfer rates higher than any known circuits that utilize a strobe and data protocol. This result is accomplished by modifying the prior art write circuitry by adding a strobe generator coupled to both the data input and the strobe input to control the write circuit multi-latch and by modifying the prior art read circuit by coupling the initial and enable circuit to the data drivers and adding a data compare circuit that is coupled between the memory storage array and the strobe toggle to control the strobe. In this way the present invention relaxes the use of the strobe to data relationships for reads and writes except when there are no data transitions and ends the necessity of aligning the strobe with the data eye. By so eliminating the need for strobe to data eye alignment the present invention can use smaller data eyes and data transfer rates higher than those that can be utilized by the prior art circuits.

10 Claims, 10 Drawing Sheets

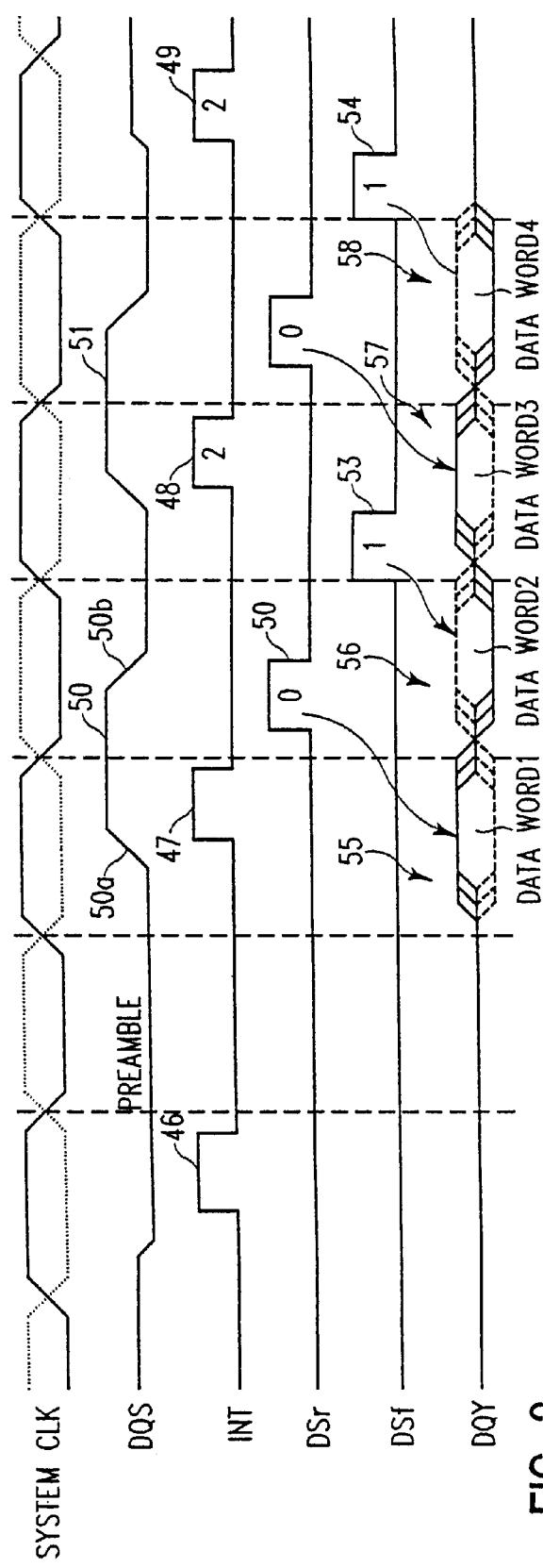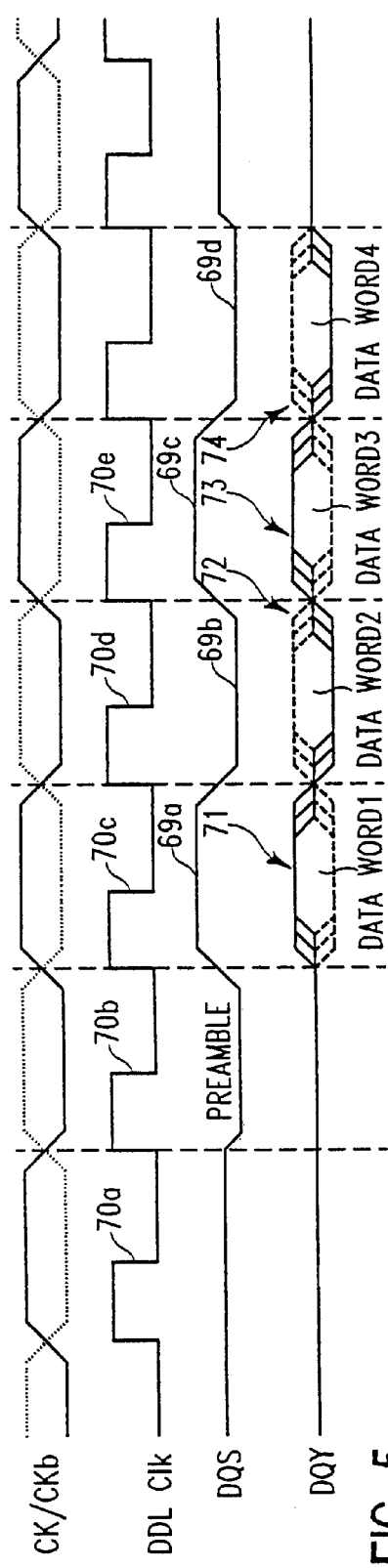
FIG. 3
FIG. 5

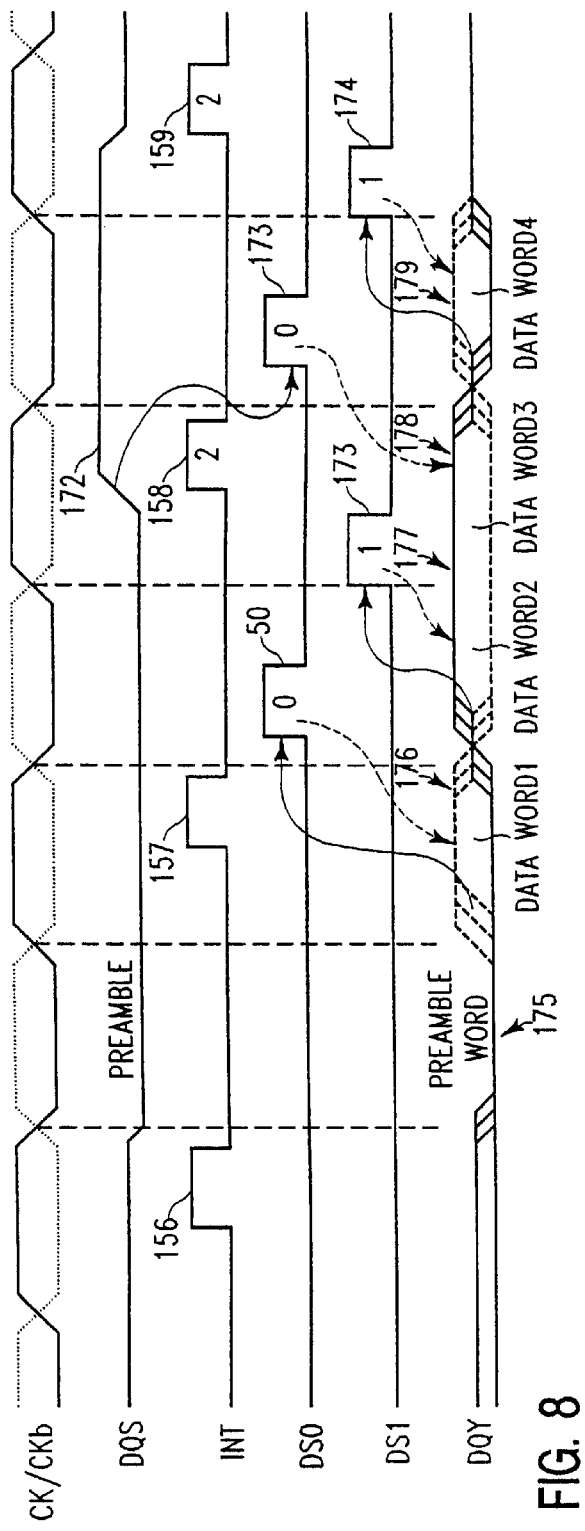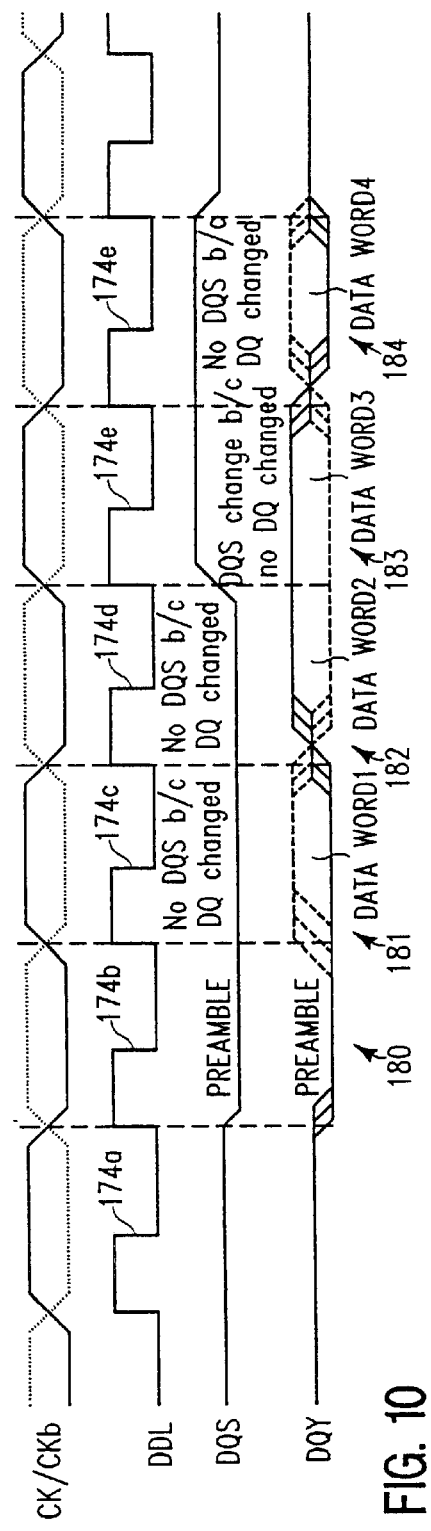
FIG. 8
FIG. 10

DATA AND DATA STROBE CIRCUITS AND OPERATING PROTOCOL FOR DOUBLE DATA RATE MEMORIES

FIELD OF THE INVENTION

This invention relates generally to computers and more particularly to a computer main memory that uses a data strobe protocol to transfer data between the computer's main memory and controller.

BACKGROUND OF THE INVENTION

A computer's main memory is comprised of numerous individual memory units such as Dynamic Random Access Memory units (DRAM)s for the storage of data. In such computers data is typically transferred into and out of the individual DRAMs to the controller in accordance with a predefined clocking scheme. For example, transferring data into and out of the DRAMs to a data controller, i.e., writing or reading, typically includes the steps of generating a suitable data signal that is sent from the controller to one or more selected DRAMs and then either writing data, from the controller, into the selected DRAMs or reading data out of the selected DRAMs and returning the data to the controller.

Today, improved DRAMs are of the class of Double Data Rate DRAMs presently referred to, in the industry, as DDR devices.

These Double Data Rate DRAMs use a data and strobe protocol to transfer the data between the memory and the controller. The period of time in which a data word can be transferred into or out of the computer's memory, i.e., written or read, is equal to one half of one cycle of the memory system clock. When reading data from a DDR device, the device drives both the data bus and the strobe simultaneously. The strobe must be toggled for each data word read from the DDR until all the data are the read out because the controller uses it to latch the incoming data word until the read is complete. The strobe is edges aligned, meaning that it transitions coincident with the data. Therefore, the controller receiving the data must phase shift the strobe in order to use it to latch the incoming data word.

When writing to a DDR device, the controller drives the data bus with the strobe centered with respect to the data, meaning that the strobe transitions in the middle of the data valid time. The controller toggles the strobe for each data word sent to the DDR device receiving the data thus the DDR device only needs to use the strobe to latch the incoming data word.

The period of time when all of the data inputs are valid at either the controller on a data read or the DDR devices on a data write is known as the "data eye". As the memory clock frequencies in computers continue to increase, the duration of this data eye gets shorter and the relationship between the strobe and data eye becomes tighter causing the aligning of these independent signals, i.e., the strobe and data eye, to become increasingly difficult because of the time variations caused by simultaneous switching outputs, noise on reference voltages, path lengths and propagation delay mismatches, crosstalk, and other such effects.

Thus the current protocol for DDR devices is to toggle the strobe with every read/write data transfer and have timing restraints on the strobe and data transfer times and as frequencies go higher these restraints on strobe and data become so stringent that a limit is quickly reached and data can no longer be transferred into or out of the DDR devices.

Therefore the currently used protocol has a problem in aligning the data strobe with the data eye as the data rates keep increasing and with faster data rates this alignment problem becomes more severe. This problem thus prevents the DDR devices from being used at their full potential.

SUMMARY OF THE PRESENT INVENTION

The invention permits a relaxing of the strobe to data eye relationship for reads and writes so that DDR devices can be used at their full potential. The present invention thus permits the use of higher frequency memory clocks which results in smaller data eyes and higher data rates.

The present invention allows all DDR devices to be used to their fullest by relaxing the timing requirements required for aligning the strobe with each data eye. In the present invention, this is accomplished by having the data self-latch when there is a transition in the data word. A data word is the summation of all of the data bits transferred from or to a DDR device on a single clock edge. A transition is any change in a bit in the data such as a change from a "1" to a "0" or vice versa. This self latching procedure means that the strobe need only be used in those cases where there is no change in the data word.

In this way, the present invention can relax the strobe to data eye alignment problem found in the prior art protocol, the use of smaller data eyes resulting higher data transfer rates.

The present invention accomplishes these desirable results by altering the prior art DDR write and read circuits as well as the memory controller write and read circuits. More particularly, the prior art DDR device write circuit and controller read circuits are modified by adding a strobe generator and coupling this generator to both the strobe and the data inputs. The DDR device read circuitry and the controller write circuitry is modified to include a data compare circuit controlling both the output latch and chip driver circuitry with some initialize and enable circuitry. These changes permit the present invention to be self-latching based on data transitions and eliminates the use of the data strobe except when there are no data transitions.

Therefore it is an object of the present invention to eliminate strobe to data relationships for reads and writes except when there are no data transitions.

It is a further object of the invention to eliminate strobe to data eye alignment when data is changing to permit the data eye to be smaller and increase data transfer rates in the computer.

These objects, features and advantages of the present invention will be become further apparent to those skilled in the art from the following detailed description taken in conjunction with the accompanying drawings wherein:.

BRIEF DESCRIPTION OF THE DRAWINGS

FIG. 3 illustrates the various clock and data pulses when data is being written into the computer memory bank using the circuit of FIG. 2;

FIG. 5 illustrates the various clock and data pulses when data is being read out of the computer memory bank using the circuit of FIG. 4;

FIG. 8 illustrates the various clock and data pulses when data is being written into the computer memory bank using the write circuit of FIG. 6A;

FIG. 10 illustrates the various clock and data pulses when data is being read out of the computer memory bank using the read circuit of FIG. 9A.

DESCRIPTION OF THE PREFERRED EMBODIMENT

Figure 1:
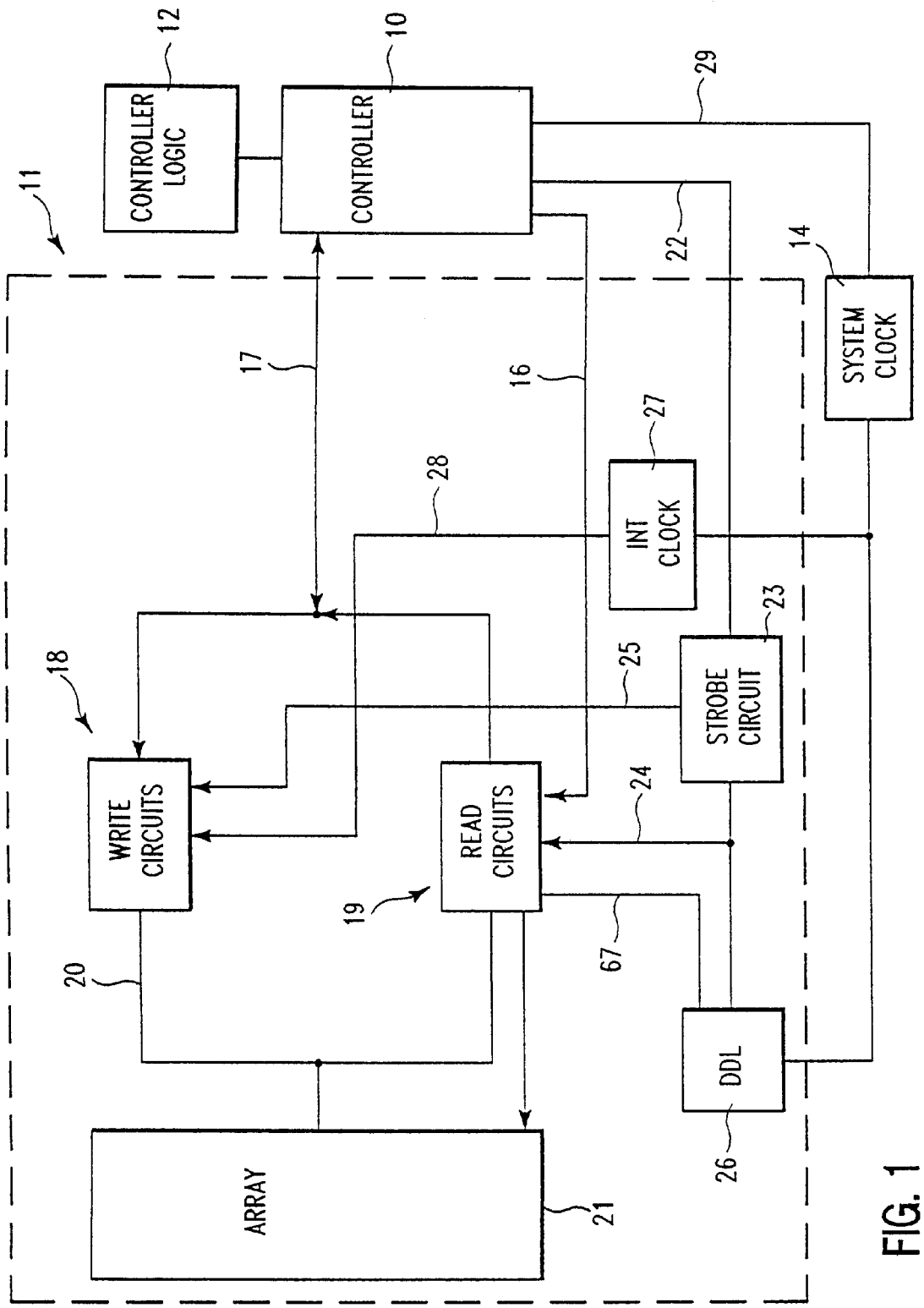
FIG. 1 is a block diagram of a computer using read write circuits.

In FIG. 1 there is shown a block diagram of a typical computer comprised of a controller logic block 12 coupled to controller 10 which is in turn coupled to a memory 11, via multi-line busses 17 and 22. A system clock 14 is also coupled to the controller 10 via a line 29. The memory 11 comprises a write block 18, a read block 19, a strobe circuit 23, a data delay phase adjusted clock 26, a storage array 21, containing a multiplicity of storage devices such as DDR DRAMs, and an internal clock 27.

Specifically, the controller 10 is coupled by a multiline bidirectional data bus 17 to the write block 18, which contains a plurality of write circuits, and to the read block 19, which contains a plurality of read circuits.

The write circuits in each block 18 and the read circuits in block 19 are each further coupled, via a respective line in the multiline bidirectional bus 20, to the storage array 21. The read circuit in read block 19 is further coupled to the controller 10, via a single line unidirectional bus 16 that carries an external address control signal from the controller 10.

Although there is a plurality of read and write circuits in the read and write blocks there need be but one strobe circuit 23 coupled to each of the plurality of write circuits in write block 18 via a multiline bus 25 and to each of the read circuits in block 19 via line 24. The strobe circuit 23 is further coupled to a data delay phase adjusted clock 26 (DDL) driven by the system clock 14. The system clock 14 also drives an internal clock 27 which is coupled to each one of the write circuits in block 18 via a single line bus 28.

It is of course well known that computers include many other circuits (not shown). However, since such computers, their general circuitry and methods of operation and usages are so well known to the art, it is not deemed necessary to further show, illustrate, elucidate or describe the various features, operations and other circuitry, necessary to the operation of such computers, that are not pertinent to the present invention.

Figure 2:
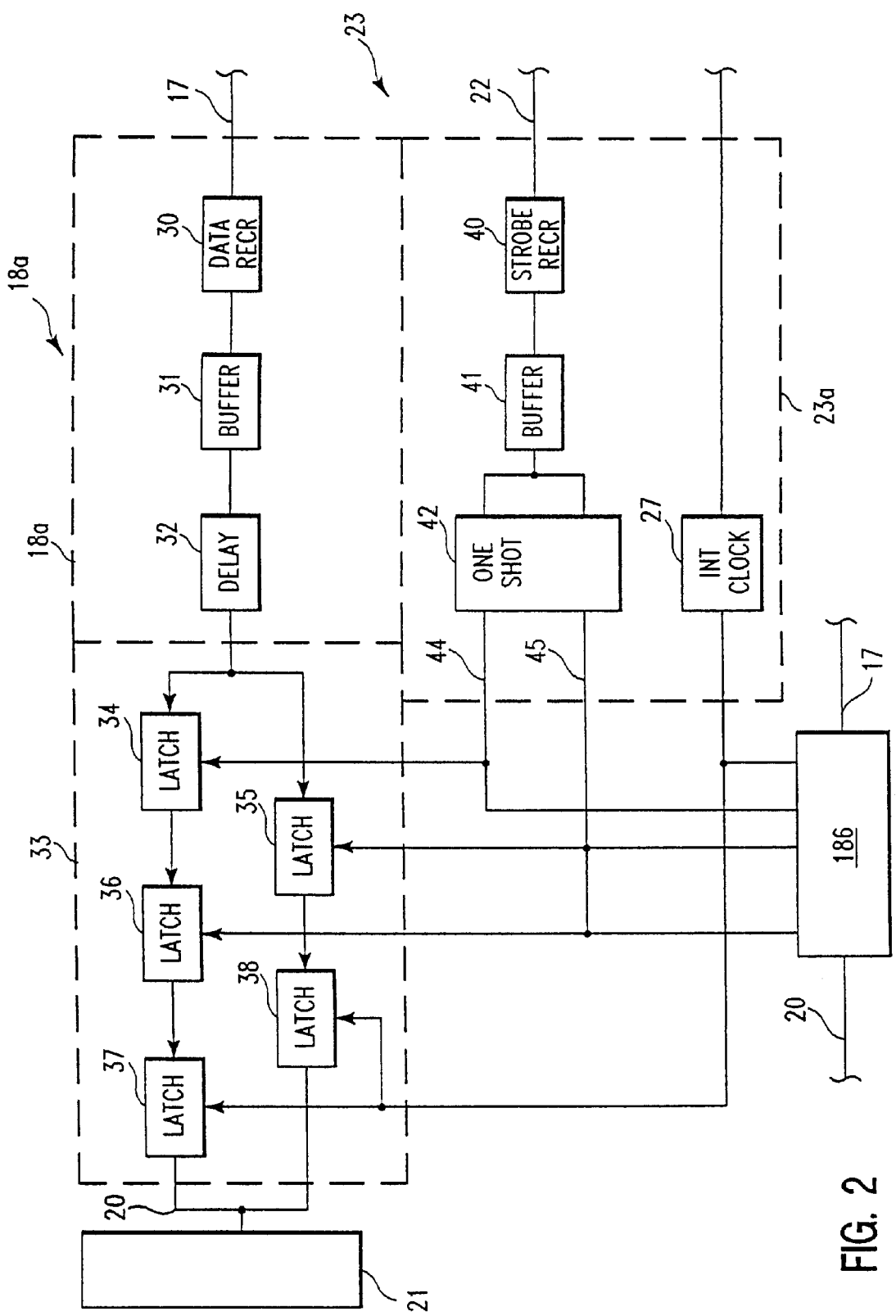
FIG. 2 is a block diagram of a computer incorporating the prior art DDR write circuits presently in use.

Referring now to FIGS. 2 and 3, the writing of information into a prior art storage array 21 using known circuits and protocol will be described.

It should be understood that computers typically have a plurality of write circuits (usually sixteen) in write block 18 and a plurality of read circuits (again usually sixteen) in read block 19. However to simplify the description of the present invention it will be assumed that the write block 18 contains but two write circuits and that the read block 19 contains but two read circuits.

Also, because one portion of the strobe circuit 23 interacts with the write circuits and a second portion interacts with the read circuits, the strobe circuit 23 will be described as having a write portion 23a and a read portion 23b.

Thus FIG. 2 shows only two write circuits 18a and 18b coupled to the write portion 23a of the strobe circuit 23. However, because the operation of any one write circuit is identical to the operation of any other write circuit only write circuit 18a is shown in detailed block form and only its operation will be described in detail below.

The write circuit 18a as shown, comprises a data receiver 30 coupled, via a respective one of the plurality of data lines in the data bus 17, to the controller 10. This data receiver 30 is also coupled, through a write buffer circuit 31, a delay circuit 32 and a multi-latch circuit 33, to the storage array 21.

The write portion 23a of the strobe circuit 23 comprises a strobe receiver 40 coupled to the controller 12 via the strobe signal line 22. The receiver 40 is further coupled through a strobe buffer circuit 41 and to a one shot circuit 42 designed to detect both the leading or rising edge and the trailing or falling edge of any strobe signal appearing on line 22. This means that the one shot circuit 42 must have two outputs lines 44 and 45 each of which is respectively connected to various respective latches in the multi-latch circuit 33 as will be further described below.

The multi-latch circuit 33 is comprised of a plurality of individual data bit latches 34, 35, 36, 37, and 38. Each of these data bit latches 34, 35, 36, 37, and 38 has respective first and second inputs and a single output and they are inter-coupled such as to even out any mismatches or errors caused by or during the transfer of the data 10 to the storage array 21 as is known to the art.

Latches 34 and 35 each has their first inputs coupled in common to the output of the delay circuit 32. Latch 34 has its second input connected to line 44 which carries the output of the one shot circuit 42 resulting from the leading edge of the strobe signal. The output of latch 34 is coupled to the first input of latch 36. Latches 35 and 36 have their second inputs coupled in common to line 45 leading from the one shot circuit 42. This line 45 carries the output of the one shot circuit 42 resulting from the trailing edge of the strobe signal. Thus, both latches 35 and 36 are responsive to the trailing edge of the strobe signal. The output of latch 35 is coupled to the first input of latch 38 and the output of latch 36 is coupled to the first input of latch 37.

The second inputs of latches 37 and 38 are coupled in common to the output of the internal clock circuit 27. The outputs of the latch's 37 and 38 are both fed to the storage array 21 via the bus 20.

With particular reference now to FIG. 3, together with continuing reference to FIG. 2, the prior art protocol writing sequence used when data is written into the storage array 21 will be briefly described.

Initially the system clock 14 is running and providing an alternating cyclic clock signal CK. Simultaneously the internal clock 27, driven by the system clock 14, is also running and putting out a signal INT that is fed to the second inputs of the latch's 37 and 38. This clock signal INT is comprised of a plurality of positive pulses 46, 47, 48 and 49 each of which is synchronous with a respective first or positive half of the alternating system clock signal CK.

As noted previously, when the computer array 21 is populated with DDR devices, the write-read protocol requires data and strobe signals to transfer a data word either into (a write operation) or out of (a read operation) the storage array 21.

Now it will be assumed that a data stream, formed of four data words (WORD 1, WORD2, WORD 3, and WORD 4) is to be written into the storage array 21. It will be further assumed that each respective data word is formed of a two of data bits and that WORD 2 and WORD 3 are identical to one another. It will be further assumed that each of these words will be transferred during a respective data eye 55, 56, 57 and 58.

When writing to the storage array 21, using the circuits of FIG. 2, the controller 10 drives the write portion 23a of the data strobe 23 by forcing its output DQS, which is normally neutral, to enter a preamble or negative state. The controller 10 will simultaneously transmit all the bits of the first data word during the data eye 55 to all the write circuits in the write block 18, via data bus 17. In this way the first bit of the data word is fed to write circuit 18a and at the same time, the second bit of the data word is fed to write circuit 18b. It should be understood that if the data word contains more than the two bits described, the memory block must contain write circuits identical in number to the number of bits in the data word. In such a case, the third bit of the data word would be sent to a third write circuit, the fourth bit of the data word would be sent to a fourth write circuit, etc. with the last or Nth bit of the data word being sent to the last or $N^{th}$ write circuit.

In each write circuit, the respective data bit is received from the controller 10 by a multi-latch circuit 33 after passing through a write receiver 30, a buffer circuit 31 and a delay circuit 32.

Simultaneously, with the sending of the respective data bits of the first data word (WORD 1) to the respective write circuits 18a and 18b, the controller 10, at the center of the data eye 55, drives strobe line 22, positive for one half of a clock cycle. This is shown as strobe pulse 50 in FIG. 3.

The strobe pulse 50 thus has its leading edge 50a centered in the data eye 55 and its trailing edge 50b centered in the data eye 56. The pulse 50 is positioned thusly so as to toggle various ones of the latches 34, 35, 36, 37 and 38 in the mufti latch circuit 33 during the time each data word is being transferred as will be discussed in detail below.

As noted above, the second data word (WORD 2) is different from the first data word (WORD 1) and thus again there is a transition and the cycle describe above is repeated.

In this way a data stream of many data words is written into the array 21 and can now be read out of the array 21 with the circuits described below in conjunction with FIGS. 4 and 5.

Figure 4:
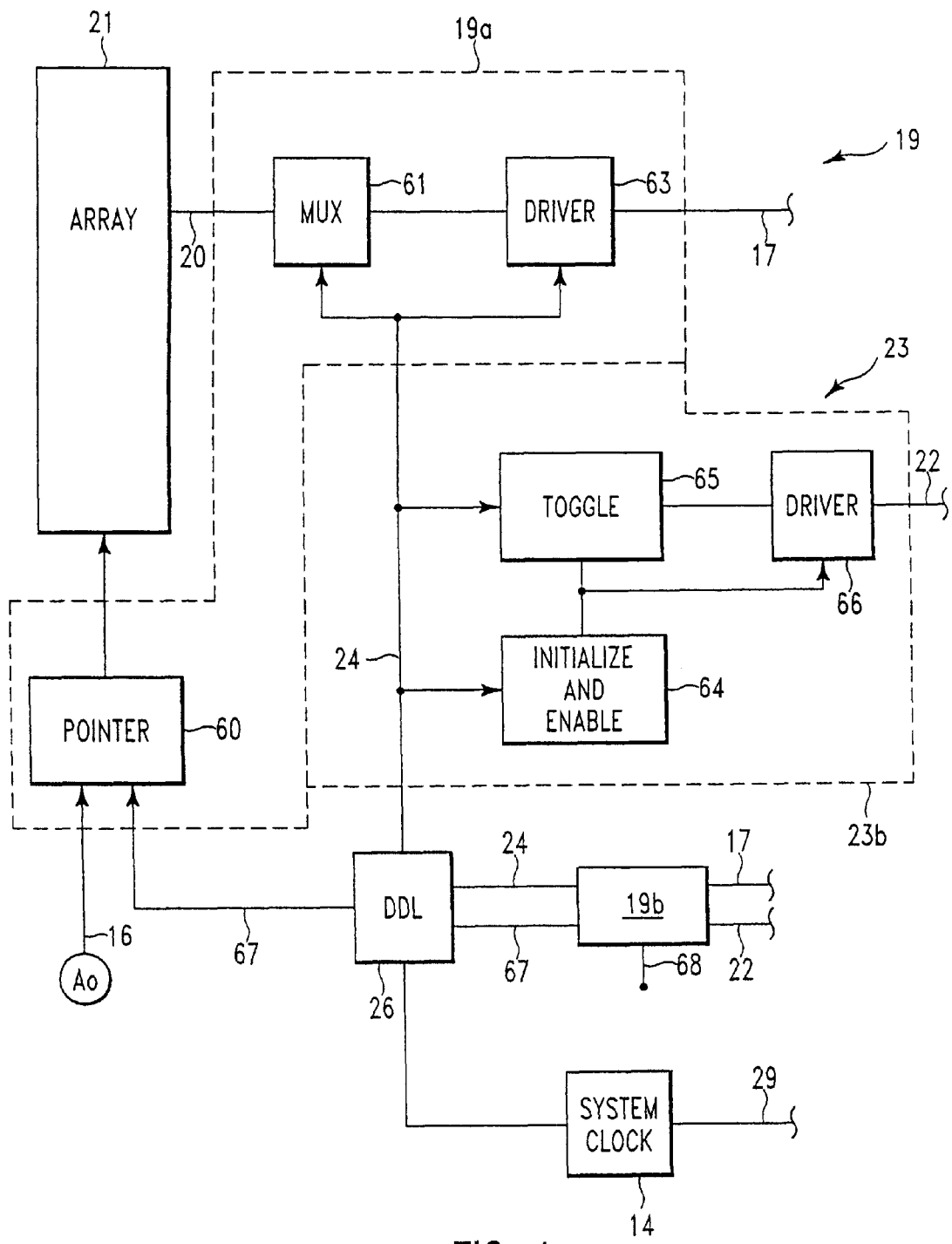
FIG. 4 is a block diagram of the prior art DDR read circuit presently in use.

FIG. 4 shows, in block form, the prior art DDR circuits which are necessary to read out data stored in the computer memory bank and to transfer the read data to the computer.

As noted previously, the read circuit block 19, as shown in FIG. 1, comprises sixteen identical read circuits 19a through 19p.

It should also be noted that some elements of the circuits used in the read circuits shown in this FIG. 4 are identical to the circuit elements shown in FIGS. 1 and 2 and will be identified by the same numbers as used in FIGS. 1 and 2.

Each such read circuit, as shown in FIG. 4, is shown as being comprised of a pointer circuit 60, designed to select the data to be read out of the array 21 through a multiplexor circuit 61 and a read driver 63 to the controller 10 via the bus 17. The read portion 23b of the strobe circuit 23 that serves all sixteen read circuits is also shown in this FIG. 4 and is comprised of a initialize and enable circuit 64, a toggle circuit 65, and a strobe driver 66. Also coupled to the controller 10 via line 22. The pointer circuit 60 has a pair of inputs, the first being a DDL Clock input 27, which is from the data delay phase adjusted clock 26 driven by the system clock 14, and the second is an external address feed 16 from the controller 10. The DDL Clock is again coupled to the initial and enable circuit 64 in the strobe read circuit 23, via line 24. The external address feed AO, on line 16, is provided by the controller 10 and is used to select the first bit of the data word to be read out of the memory storage array 21. Simultaneously the DDL clock activates the initial and enable circuit 64.

The output of the initial and enable circuit 64 is fed to the toggle circuit 65 and to the strobe driver 66 and is shown as pulses 70a, 70b, 70c, and 70d. The output of the toggle circuit 65 is alternate "1"s and "0"s.

When the array 21 is stimulated by the pointer circuit 60, each bit of the identified data DQY to be read therefrom, is transferred through a respective multiplexor in a respective read circuit in the read circuit block 19 to the read data drivers 63 from whence the data is sent to the controller 10 and the toggle 65 stimulates the strobe driver 66 such that the strobe pulse is aligned with each burst of the data stream DQY as shown in FIG. 5.

In summary, the Double Data Rate (DDRI) SDRAMs of the prior art uses a data and strobe protocol to transfer the data word between the array 21 and the controller. When writing to the prior art Double Data Rate (DDRI) SDRAMs, the controller drives the data bus with the strobe (DQS) pulse centered in the data eye and toggles the strobe for each data word being written only need to use the strobe (DQS) to latch the incoming data word. On the other hand, when reading from the prior art Double Data Rate (DDRI) SDRAMs, the data bus and the strobe are driven together. Thus the strobe, being edge aligned, by the DDL clock is toggled for each data word driven out until the read burst in complete.

Again it should be remembered that, regardless of the number of read circuits, only one read portion 23b of the strobe circuit 23 is needed to serve all the read circuits in the circuit block 19. This read portion 23b, of the strobe circuit 23, is comprised of a initialize and enable circuit 64, a toggle circuit 65, and a strobe driver circuit 66. Driver circuit 66 is coupled to the controller 10 via line 22.

The pointer circuit 60 has a pair of inputs, the first being an input from the data delay phase adjusted clock 26 driven by the system clock 14, and the second the external address feed 16 from the controller 10. The DDL Clock is also coupled to the initial and enable circuit 64, the toggle circuit 65, the multiplexor 61 and the read data driver 63 via line 24.

With particular reference now to FIG. 5, together with continuing reference to FIG. 4, the prior art protocol read sequence used when data is read from the storage array 21 will be briefly described.

It will be assumed that the data stream, comprised of the four data words, (WORD 1, WORD2, WORD 3, and WORD 4) previously written into the array 21 will now be read from the array 21.

Initially both the system clock CK and the data delay clock DDL are both running as shown in FIG. 5. As can be seen from pulses 70a, 70b, 70c, 70d and 70e, the DDL clock is running at twice the speed of the system clock 14. When data is to be read out of the array 21 the strobe 23b is driven negative into its preamble mode and then driven positive, pulse 69a, in conjunction with the receipt of the following DDL pulse 70c. Simultaneously, an external address feed signal is sent from the controller 10, via line 16, to activate the pointer 60 to select the first bit of the first data word (WORD 1) to be read out of the storage array 21 and then the DDL pulse 70c activates the multiplexor 61, the driver 63, the toggle 65 and the initialize and enable circuit 64.

With the storage array 21 so stimulated by the pointer circuit 60, the first bit of the identified data word (WORD 1) to be read therefrom, is transferred, during the data eye 71 through the multiplexor 61, in read circuit 19a to the read data driver 63 form whence the bit is sent to the controller 10. The second bit in the data word (WORD 1) is similarly transferred (read) by the read circuit 19b to the controller 10.

Because the toggle circuit 65 has been initialized by the initial and enable circuit 64 it is toggled from a "0" to a "1" by each DDL clock pulse to produce alternating "1"s and "0"s that are fed to the strobe driver 66 to set it in condition to drive the read data word to the controller 10.

Once the first data word (WORD 1) is read out, the positive pulse 69a is terminated and the strobe DQS is driven negative, pulse 69b, so that the second data word (WORD 2) in the data stream can be read out of the array 21 during the data eye 72. Subsequently, after the second data word is read, the strobe pulse is again made positive, pulse 69c, and the third data word (WORD 3) read out during data eye 73. This cycle continues until all the data words in the data stream are read out.

The string of alternating "0"s and "1"s from the toggle 65 stimulates the strobe driver 66 to provide the alternating positive and negative pulses 69a, 69b, 69c, and 69d as needed.

In summary, the prior art circuits, shown in FIGS. 2, 3, 4, and 5, use a data and strobe protocol to transfer, i.e., read or write, a data word between the storage array 21 and the controller 10. When writing, using the prior art protocol, the controller 10 drives the data bus 17 with the strobe (DQS) pulse 50 centered in the data eye and toggles the strobe for each data word being written and only needs to use the strobe (DQS) to latch the incoming data word. On the other hand, when reading, using the prior art protocol, the data bus and the strobe are driven together and the strobe is edge aligned with the data eye and toggled for each data word read out until the read is complete.

Therefore, even though the site being written into only uses the strobe to latch the incoming data word, with increasing frequencies, the data eye gets correspondingly smaller and the relationship between the strobe and data eye becomes tighter causing the alignment of the independent strobe and data signals to become increasingly difficult to achieve. These difficulties arise because of time variations created by simultaneous switching outputs, noise on reference voltages, path length propagation delay mismatches, crosstalk and etc. all of which limit the speed of the system.

Although the above described read write circuits and protocols are suitable for use with the prior art DRAMs they do not operate fast enough to permit newer DDR DRAMs to be used at their full potential and speed.

The present invention relaxes the aligning the strobe DQS and the data eye by causing the data bits to be self latching based on changes or transitions in the data word so that the data strobe need only be used when there are no data transitions. When there are no transitions the data eye is very large since the data has not changed for two data cycles, making it much easier to align the strobe to the data eye. This permits the use of higher data transmission rates and correspondingly smaller data eyes.

Referring now to FIGS. 6A, 6B, 7, 8, 9A, 9B and 10, the writing and reading circuits and the protocol of the present invention, which is needed for the efficient transferring of data into or out of a storage array populated with the newer DDR DRAMs, will be described below.

Broadly, the present invention permits the controller and memory device to use a data transition, i.e., a change in the data being either written into or read out of the storage array 21, to generate a local latching strobe per data bit and does so by combining, in a strobe generator, all the local latching strobes in the data word to provide a single global latching strobe that latches the incoming data word. However, when there are no transitions in the data, i.e., the data word being received is the same as the previous word, the data strobe DQS passes through the strobe generator to act as the global latching strobe.

In this way the present invention eliminates the need for strobe to data word alignment and causes the apparatus to be self-latching thereby resulting in a higher read write data transfer rate. This higher rate allows the newer, faster DDR DRAMs to be used at their design rates.

Figure 6A:
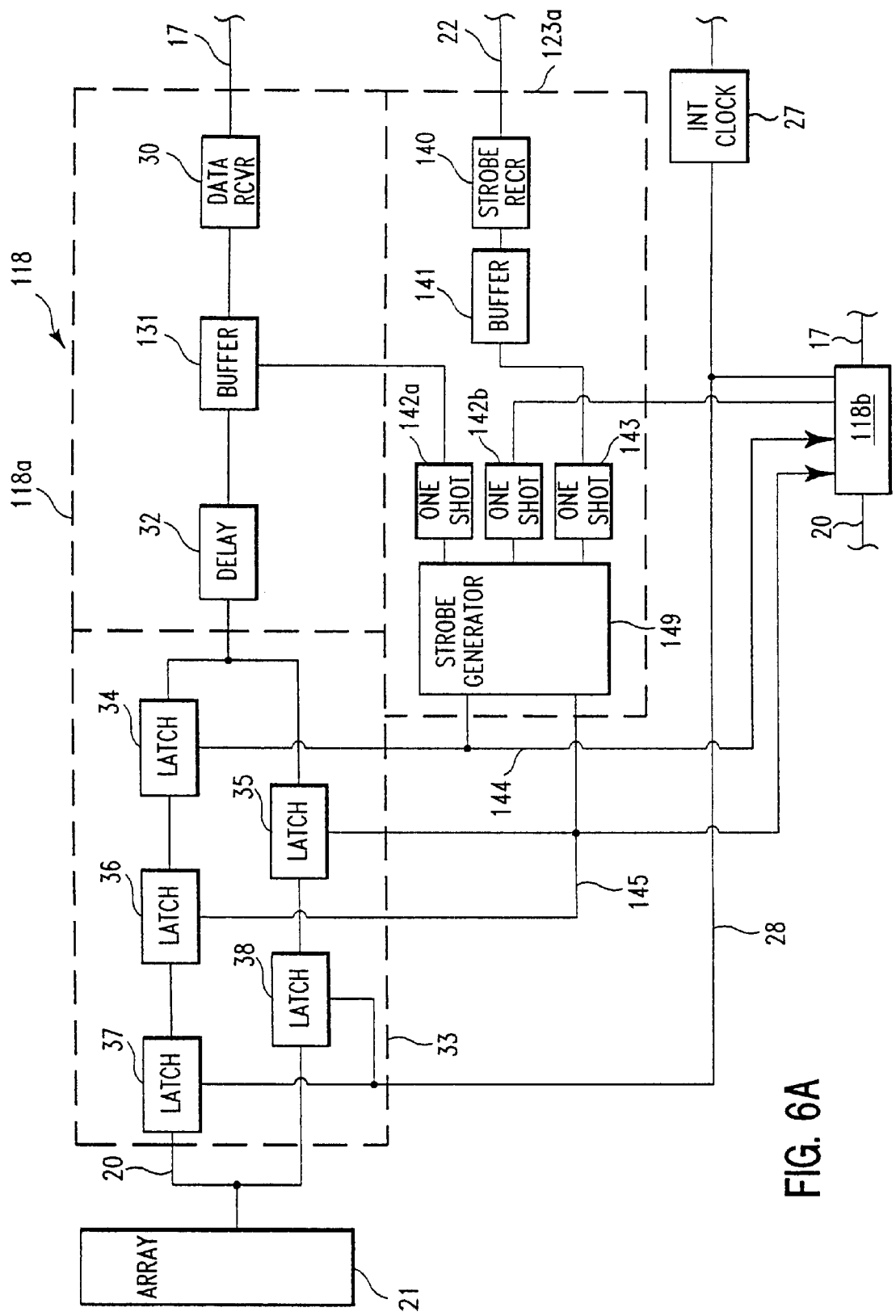
FIG. 6A is a block diagram of the DDR write circuits of the present invention.

FIG. 6A shows, in block diagram form, the improved write circuits 118a and 118b of the present invention together with the write portion 123a of an improved strobe circuit 123 designed for use with a storage array 21 employing the newer, faster DDR DRAMs. It should be understood that the present invention will also operate with the older, slower DDR DRAMs.

In the following description of the present invention it is to be remembered that again all the write circuits in the write circuit block 118 are identical. Thus the write circuit 118a is identical to the write circuit 118b. Therefore only the write circuit 118 and its operation need will be described in detail. It should also be noted that some elements of the circuits used in the present invention are identical to the equivalent circuit element shown in FIG. 2. Thus, those identical circuit elements will be identified by the same numbers as used in FIG. 2.

The write circuit 118a comprises a data line receiver 30, coupled to a respective one of the plurality of data lines in the data bus 17, through a data buffer circuit 131, a delay circuit 32 and a multi-latch circuit 33, to the storage array 21. The data buffer circuit 131 of the write circuit 118a is also coupled to a strobe generator 149, via a one shot circuit 142a. The write circuit 11 8b is similarly coupled to the strobe generator 149 via one shot circuit 142b. The write portion 123a of strobe circuit 123 comprises a receiver 140 coupled to the controller 10, via strobe signal line 22, and to a strobe buffer circuit 141 whose output is coupled through a one shot circuit 143 to a strobe generator 149.

Figure 7:
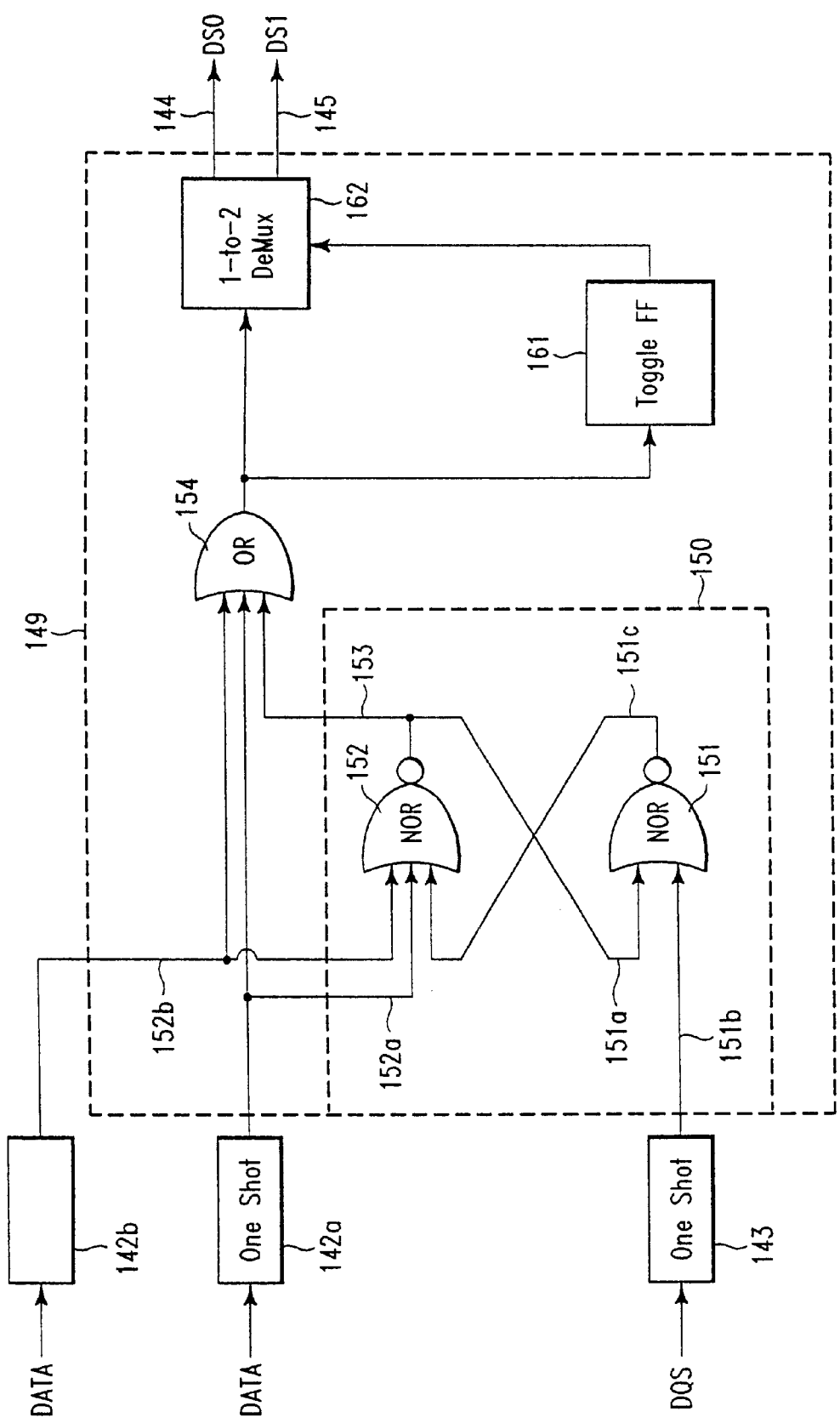
FIG. 7 is a block diagram of the strobe generator shown in FIG. 6A.

The strobe generator 149, shown in FIG. 7, is designed to combine the pulses from the data one shot circuits and does so by taking all the pulses from the data one shot circuits 142a and 142b and, together with the output of the latch 150, combining them in the OR circuit 154 to create a single output pulse based on the state of all the individual pulses received. This output pulse is sent from the OR circuit 154 to the toggle 161 and to the 1 to 2 DeMux 162. Also coupled to the strobe generator 149, via one shot circuit 142b, is the write circuit 118b.

It should be understood that if there are more than two write circuits then each such write circuit is would be coupled to the strobe generator 149 though a respective one shot circuit. That is, if there are sixteen write circuits, each is coupled to the strobe generator 149 through a respective one shot circuit.

The Strobe generator 149, shown in FIG. 7 is contains a latch 150 formed of cross-coupled NOR circuits 151 and 152. The NOR circuit 151 is a two input NOR having a first input 151a coupled to the output of the NOR circuit 152. and the other input 151b coupled to the strobe driven one shot circuit 143. The output 151c, of NOR circuit 151, is cross-coupled to a first input of the NOR circuit 152. The NOR circuit 152 has, in addition to this first input 151c additional multiple inputs. In the example given only two write circuits 118a and 118b are shown coupled to the strobe generator 149. Thus in FIG. 7 there is shown additional inputs 152a and 152b each of which is respectively coupled to the output of a respective one of the write one shot circuits 142a and 142b. The number of these inputs for this NOR circuit must equal the number of one shot circuits coupled thereto, i.e., the number of data bits in the word to be transferred and also have an additional input coupled to the output of the NOR circuit 151 as discussed above and shown in FIG. 7. For example, if a sixteen bit, data word was to be written into the storage array 21, the NOR circuit 152 would have seventeen inputs, sixteen of these would be coupled to the necessary sixteen write circuits and the seventeenth one coupled to the output of NOR circuit 151.

The one shot circuits 142a, 142b and 143 are all designed to detect the both the leading edge and the trailing of a signal passing there through.

The output 153, of latch 150 is fed to OR circuit 154 together with all the outputs of the data one shot circuits 142a and 142b are also fed. The OR circuit 154 must also have seventeen inputs, sixteen of these would be coupled to the necessary sixteen write circuits and the seventeenth one coupled to the output of NOR circuit 151. The OR gate 154 takes all these inputs and emits a single pulse that is sent to both a toggle circuit 161 and a 1–2 DeMux circuit 162 having output lines 144 and 145.

In this way the strobe generator circuit 149 detects when any data word transitions, i.e., changes from the immediately preceding data word.

This detection of these transitions is accomplished because the strobe generator 149 multiplexes all the strobe generator inputs onto the strobe generator outputs 144 and 145. Channel 144 is the first channel to be used and then the strobe generator output is toggled, by toggle circuit 161 to alternate the signals between the output lines 144 and 145.

The multi-latch circuit 33, in FIG. 6A, coupled to the outputs of the strobe generator 149, is identical to that shown in FIG. 2 in that it is comprised of a plurality of individual latches 34, 35, 36, 37, and 38 each of which has respective first and second inputs and a single output.

The first inputs of the latches 34 and 35 are coupled in common to the output of the delay circuit 32. Latch 34 has its second input connected the first output 144 of the strobe generator 149 and its output coupled to the first input of latch 36. Latches 35 and 36 have their second inputs coupled in common to the output 145 of the strobe generator 149 and thus both latches 35 and 36 are responsive to the signal on line 145. The output of latch 35 is coupled to the first input of latch 38 and the output of latch 36 is coupled to the first input of latch 37. The second inputs of latch 37 and 38 are coupled in common to the output of the internal clock circuit 14 in controller 10 and their outputs are both coupled to the storage array 21 via the write bus 20.

Figure 6B:
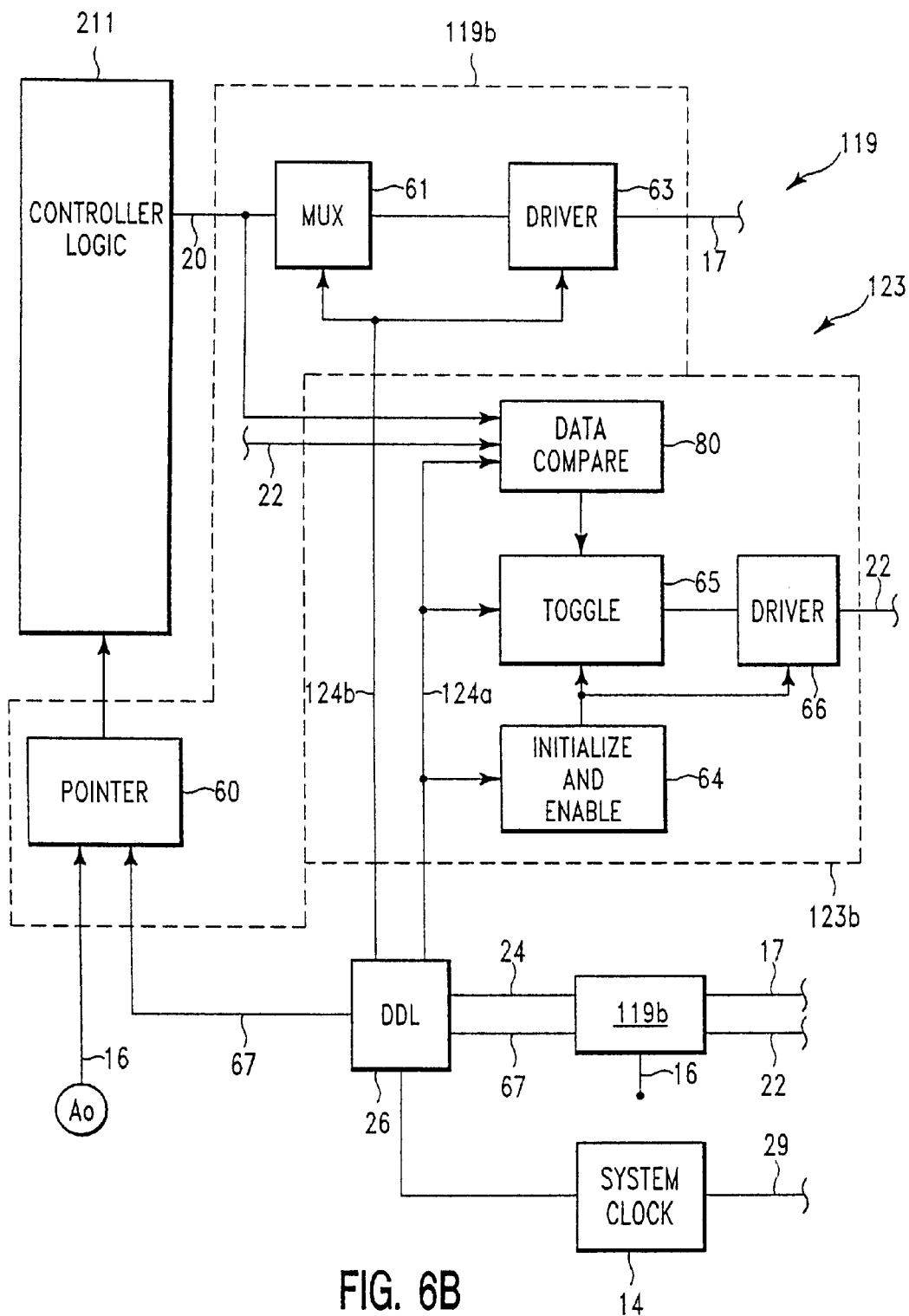
FIG. 6B is a block diagram of the controller circuit of the present invention used to transfer the data from the computer to the write circuit of FIG. 6A.

FIG. 6B is a block diagram of a controller transfer circuit used to transfer data from the controller logic circuits to the write circuits shown in FIG. 6A. It should also be noted that some of the elements used herein are identical to the circuit elements shown in FIG. 4 and will be identified by the same numbers as used in FIG. 4.

The controller 10, as shown in FIG. 6B, contains a plurality of identical data bit selection and transfer circuits 119a and 119b equal to the number of write circuits in FIG. 6A.

For illustrative purposes only circuit 119a will be describe in detail. Thus, circuit 119a is comprised of a pointer circuit 60, designed to select those logic circuits in the controller logic 211 that are to send a first bit of data stream to be written into the write circuit 118a shown in FIG. 6A. Similarly the circuit 119b would send the next bit of data, in the data stream to be written into the write circuit 118b shown in FIG. 6A. Thus each received data bit is sent through a respective multiplexor circuit 61, read data driver circuit 63 and bus 17 to the write circuits of FIG. 6A from the controller logic 221. This controller transfer circuit also has a strobe circuit 123 that serves all the write circuits in FIG. 6A.

Again, although there is a plurality of data bit selection and transfer circuits 119a and 119b but one strobe circuit 123 is needed to serve all the data bit selection and transfer circuits regardless of whether there are two circuits or sixteen circuits.

This strobe circuit is comprised of a initialize and enable circuit 64, a toggle circuit 65, and a strobe driver circuit 66 coupled to the write circuit of FIG. 6A via line 22. The pointer circuit 60 has a pair of inputs, the first being a DDL Clock input 67, which is from the data delay phase adjusted clock 26 driven by the system clock 14, and the second an external address feed 65. The DDL Clock is coupled via line 124a to the initial and enable circuit 64 and the toggle circuit 65 and via line 124b to the Mux circuit 61 and the read data driver circuit 63.

Now, with particular reference to FIGS. 6A, 6B, 7 and 8, the write protocol of the present invention will be briefly described.

Initially the system clock 14 is running and providing an alternating cyclic clock signal CK. The internal clock 27, driven by the system clock 14, is also running and putting out a signal INT comprised of a plurality of positive pulses 156, 157, 158 and 159. These pulses are fed to the second inputs of the latches 37 and 38 and each pulse is synchronous with a respective first or positive half of the alternating system clock signal CK.

The write protocol of the present invention also requires data and strobe signals to transfer a data word into (write) the storage array 21 however, in the present invention, when sequential words transition, i.e., change, the strobe signal from the controller need not be changed or altered for the strobe generator 149 will provide local latching signals for transferring the data through the latch 33. Thus, in the present invention, the strobe signal need be generated only when there is no transition, i.e., a difference, in sequentially transmitted words.

This is achieved, in the present invention by using the strobe generator to detect any difference in the sequential words and to use these differences to drive the toggle 161 and the 1–2 DeMux circuit 162 as to alternately provide and steer appropriate signals onto the strobe generator outputs 144 and 145. These signals so appearing alternately on outputs 144 and 145 operate the latch 33 so as to transfer the received data through the latch 33 so that it may be written into the array 21. By doing so the controller 10 need change the status of the strobe signal DQS only when the following or subsequent word is unchanged from the preceding transmitted data word. The operation of this strobe generator will be more fully described below.

For purposes of illustration only, it will again be assumed that a data stream, formed of four data words (WORD 1, WORD 2, WORD 3, and WORD 4) is to be written into the storage array 21 and that WORD 2 and WORD 3 are identical and that each respective data word is again formed of a two of data bits and will be transferred during a respective data eye.

When writing to the storage array 21, using the circuit of FIG. 6A, the controller 10, via line 22, forces the normally neutral strobe output DQS negative into preamble mode. This negative preamble mode passes through the strobe receiver 140, the buffer circuit 141 and the one shot circuit 143 to the strobe generator 149. Simultaneously, the controller 10 also transmits on bus 12 a preamble word consisting of all "0"s to all the write circuits in the write block 118. The bits forming this preamble word are used to precondition the one shot circuits 142a and 142b to the strobe generator 149.

Following this preamble word the data stream is initiated and the data bits of the first data (WORD 1) are sent, from the controller logic circuits via respective data transfer circuits 119a and 119b, to the respective write circuits 118a and 118b. That is; the first bit of the data word is fed to write circuit 118a from the controller transfer circuit 11 9a and the second bit of the data word is sent from the controller transfer to write circuit 118b. Again, it should be understood that if the data word contains more than the two bits described, the memory block must contain write circuits identical in number to the number of bits in the data word. In such a case, the third bit of the data word would be sent to a third write circuit, the fourth bit of the data word would be sent to a fourth write circuit, etc. with the last or $N^{th}$ bit of the data word being sent to the last or $N^{th}$ write circuit.

In each write circuit, the respective data bit is received from the controller 10 by a multi-latch circuit 33 after passing through a write receiver 30, a buffer circuit 131 and a delay circuit 32. The buffer circuit 131 also transmits a signal to the strobe generator 149 via the one shot generator 142a simultaneously with the strobe signal sent to the strobe generator 149 via the one shot circuit 143.

In the strobe generator 149 the latch 150 receives all the signals from all the one shot circuits 142a, 142b and 143 and feeds its output, via output 153, to the OR circuit 154. The OR circuit also receives the outputs of the one shot circuits 142a and 142b and ORs these signals to emit a single pulse that is sent to both the toggle circuit 161 and the 1–2 DeMux circuit 162 having output lines 144 and 145.

This output signal from OR circuit 154 passes through the DeMux circuit 162 onto its output line 144 as pulse 170. The pulse 170 sets latch 34 to receive the first data bit (WORD 1) and switches the toggle 161 such that when the second word (WORD 2) is received the next pulse 171 into DeMux circuit 162 will be directed onto its output line 145 to set the latch 35 to receive the first bit of the next word (WORD 2) and sets latch 36 to receive the first bit of (WORD 1) in the data stream and the next internal pulse 158 sets latches 37 and 38 to write the first two words (WORD 1 and Word 2) to the array 21. In this way the data bits are passed through the Latch 33 and written in the array 21. The following pulse 161 also toggle the various ones of the latches 34, 35, and 36 in the multi-latch circuit 33 during each data word being transferred in an identical manner.

Subsequently the OR circuit 154 sends a pulse causing the toggle to reset the DeMux circuit 162 so that the next signal sent to the DeMux circuit 162 will be first sent to its output line 144.

The strobe pulse DQS remains low in this preamble state until the received word is identical to the preceding word. As noted previously WORD 3 is identical to WORD 2. Now, in this case, a local latching strobe will be not be created by the described circuitry and the strobe DQS must be driven positive as pulse 172 before WORD 3 can be written into the array 21.

When writing to the storage array 21, using the circuit of FIG. 6A, the controller 10 drives the write portion 123a of the data strobe 123 to force its output DQS, which is normally neutral, to enter a preamble or negative state. Simultaneously during a first data eye 175, the controller, via the data bus 12, transmits to all the write circuits in write block 118 a preamble data word that contains all "0"s. This preamble is comprised of all "0"s to precondition the data inputs. That is, the data inputs need to be preconditions for the one shot circuits to work.

The first bit of the preamble word is fed, via transfer circuit 11 9a, to write circuit 118a and, at the same time, the second bit of the preamble word is fed, via transfer circuit 119b, to write circuit 118b. It should be understood that if the data word contains more than the two bits described, the memory block must contain write circuits identical in number to the number of bits in the data word. In such a case, the third bit of the data word would be sent to a third write circuit, the fourth bit of the data word would be sent to a fourth write circuit, etc. with the last or $N^{th}$ bit of the data word being sent to the last or $N^{th}$ write circuit.

In each respective write circuit, the respective data bit sent, by the controller 10, to each write circuit is passed through the circuit's write receiver, buffer circuit and delay circuit to the circuit's multi-latch circuit. As the data bit passes through the buffer circuit on each circuit, each respective buffer circuit transmits a signal to a respective one shot circuit coupled to the strobe generator. Each respective one shot circuit then forwards a pulse the strobe generator. In the strobe generator all received pulses are combined and used to control the multi-latch on each word circuit so as to pass the received data word through to the data array 21.

Specifically, when write circuit 118a receives the first data bit of the data word (WORD 1) from the controller 10, the received data bit passes through the write receiver 30, buffer circuit 131 and delay circuit 32 to the first input of latch 34.

The data bit passing though the buffer circuit 131 generates a signal that is sent to one shot circuit 142a from whence it is sent to the strobe Generator 149. At the same time, circuit 118b is receiving the second bit of the data word (WORD 1) and its buffer circuit is sending a similar signal to one shot circuit 142b which is also forwarded to the strobe generator 149. In the Strobe generator 149 these signals are combined and transmitted, via the 1–2 DeMux circuit 162 to the output lines 144 to trigger the latch 34 in multi-latch 33.

When the first data eye 176 ends, the next data eye 177 begins and the controller 10 transmits, to all the write circuits in the write block 118, all the bits of the data word (WORD 2). In this way the first bit of the data word (WORD 2) is fed to write circuit 118a and, at the same time, the second bit of the data word (WORD 2) is fed to write circuit 118b. Again, when write circuit 118a receives the first data bit of the data word (WORD 2) from the controller 10, the received data bit passes through the circuit's write receiver 30, buffer circuit 131 and delay circuit 32 to the first input of latch 34. The data bit passing though the buffer circuit 131 generates a signal that is sent to one shot circuit 142a from whence it is sent to the strobe Generator 149. At the same time, circuit 118b is receiving the second bit of the data word (WORD 2) and its buffer circuit is sending a similar signal to one shot circuit 142*b* which is also forwarded to the strobe generator 149. Again, in the Strobe generator 149, these signals are combined and transmitted, via the 1–2 DeMux circuit 162 to the output lines 145 to trigger the latch 35 and 36 in multi-latch 33.

As noted above, the first data word (WORD 1) is different from the second data word (WORD 2) and these differences are recognized by the strobe generator which issues a local latching pulse 170 and 171. That is, when data word (WORD 1) is transmitted, the pulses sent by all the one shot circuit 142*a*, 142*b* and 143 are all received and combined in the strobe generator to produce the local latching strobe pulse 170 on line 144 which permits the latch 34 in the multi-latch circuit 33 to receive the data word.

However WORD 3 is identical to WORD 2 thus a local latching strobe is not produced by the strobe generator 149 and a global latching strobe DQS must be transmitted by the controller 10 as shown by pulse 172. The rising edge of this strobe pulse 172 is used to generate a pulse 173 on the strobe generator output line 144 to latch Word 3 through the multi-latch 33.

Since WORD 4 is different from WORD 3 the local latching pulse 173 is generated as described above in conjunction with the data words (WORD 1) and (WORD 2).

Figure 9A:
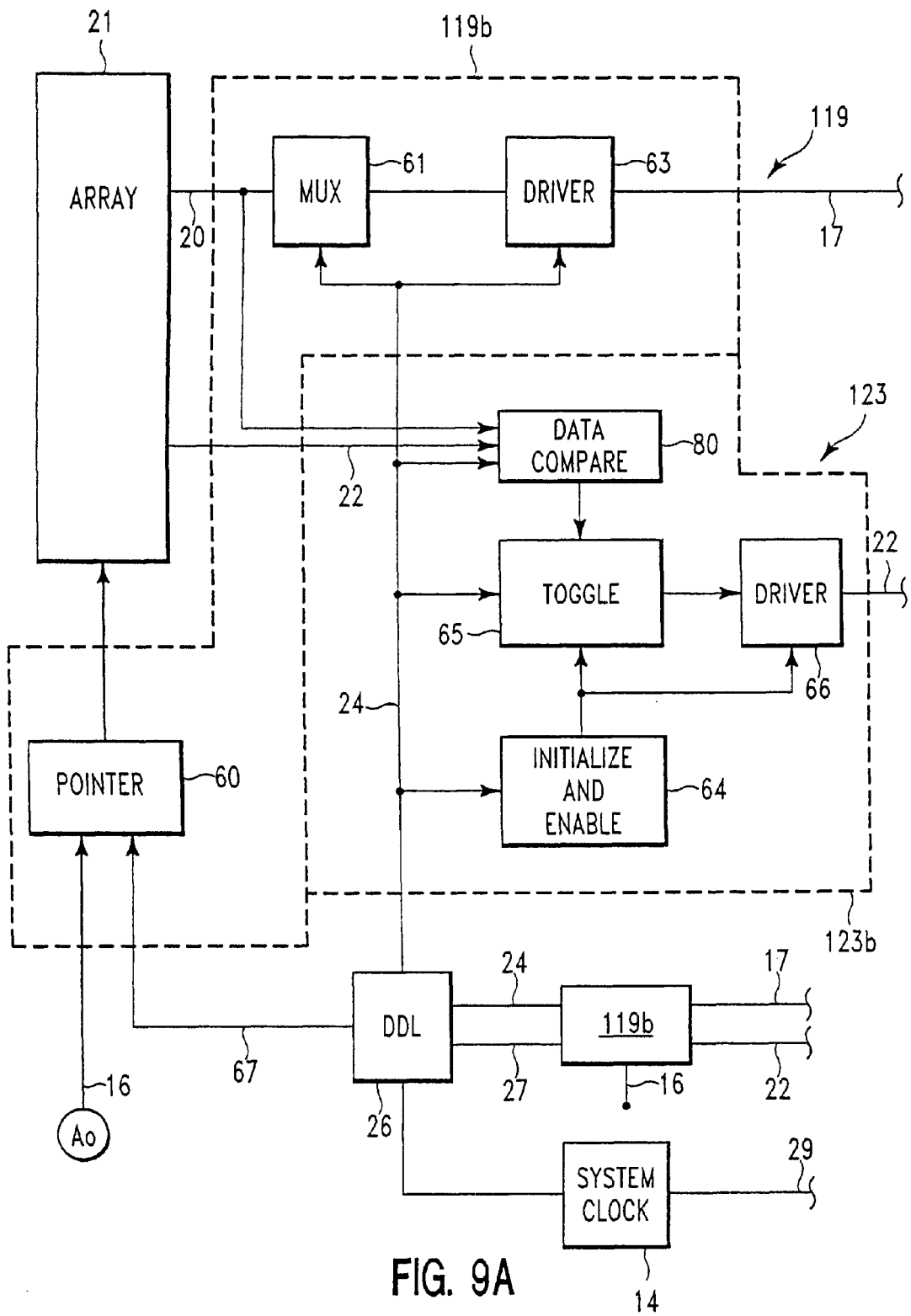
FIG. 9A is a block diagram of the DDR read circuit of the present invention.
Figure 9B:
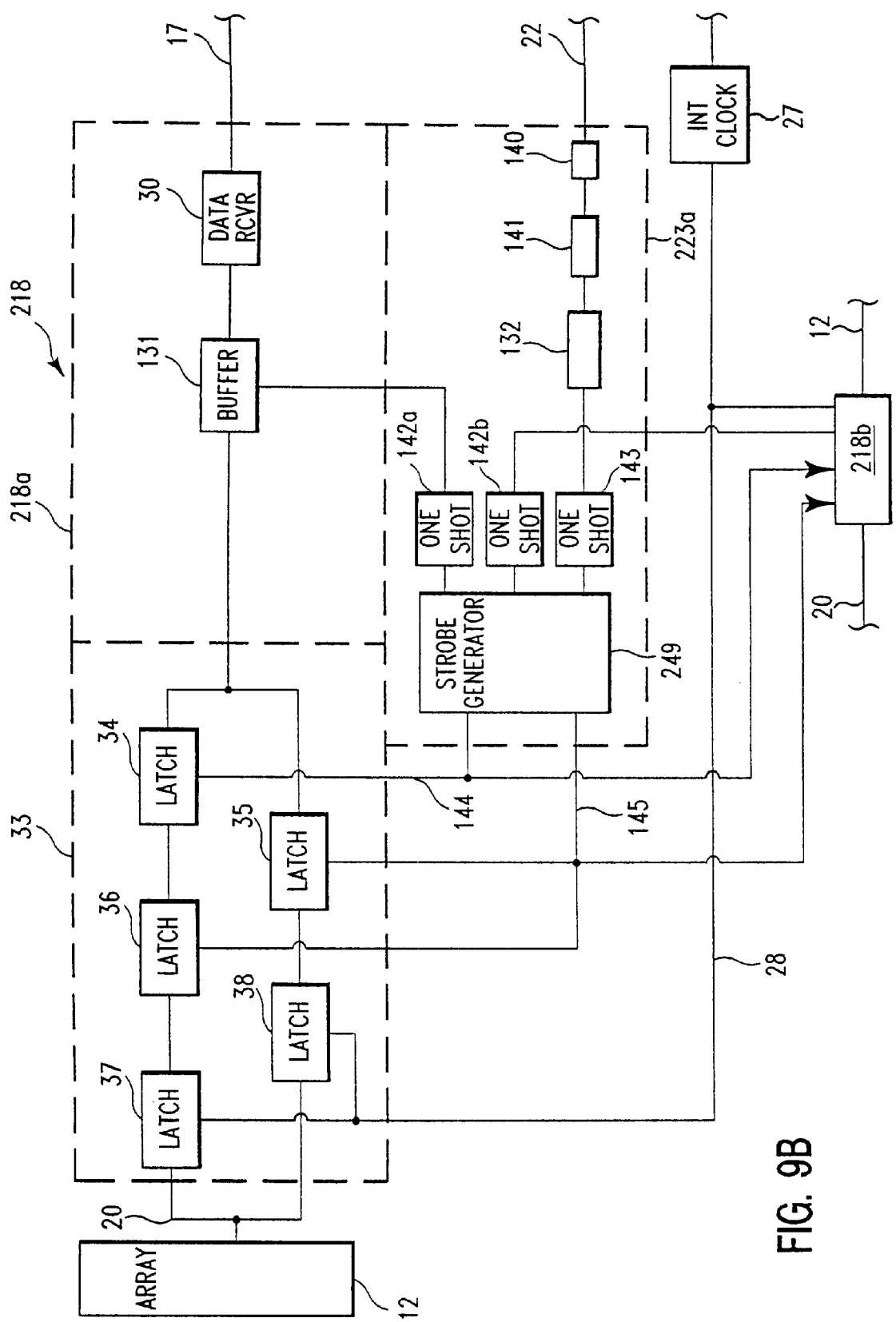
FIG. 9B is a block diagram of the controller circuit of the present invention used to transfer the data from the read circuit of FIG. 9A into the computer.

Turning now to FIGS. 9A, 9B and 10 the read circuit of the present invention and its operation will be described. FIGS. 9A shows, in block form, the improved read circuit 219*a* and 219*b* of the present invention together with the read portion of a strobe circuit 223 designed for use with a computer employing the newer, faster DDR DRAMs, FIG. 9B is a block diagram of the controller circuit of the present invention used to transfer the data from the read circuit of FIG. 9A into the computer and FIG. 10 illustrates the various clock and data pulses necessary to read out data words stored in the computer storage array 21. It should, of course, be understood that the present invention will also operate with the older, slower DDR DRAMs as well as with the newer, faster DDR DRAMs.

In the following description of the present invention it is to be remembered that the read circuit 219*a* is identical to the read circuit 219*b* thus only the read circuit 219*a* and its operation need will be described in detail. It should also noted that some of the circuits used in the read circuit of the present invention are substantially identical to the read circuit shown in FIG. 4 and these identical circuit elements will be identified by the same numbers as used in FIG. 4.

Each such read circuit, as shown in FIG. 9A, is comprised of a pointer circuit 60 designed to select the data to be read out of the storage array 21. The data so selected is sent by the storage array 21 through a multiplexor circuit 61 to a read driver 63 which for delivers the read data to the controller 10 via the bus 17.

Again it should be remembered that regardless of the number of read circuits used only one read portion 223*b* of the strobe circuit 223 is needed to serve all the read circuits in the circuit block 19. This read portion 223*b*, of the strobe circuit 223, is comprised of a initialize and enable circuit 64, a toggle circuit 65, a data compare circuit 80 and a strobe driver 66 coupled to the controller 10 via line 22. Again the pointer circuit 60 has a pair of inputs, the first being a DDL Clock input 67, which is from the data delay phase adjusted clock 26 driven by the system clock 14, and the second is an external address feed 16 from the controller 10. The DDL Clock is also coupled to the initial and enable circuit 64, the toggle circuit 65 and the data compare circuit 80. The external address feed AO, on line 16, is provided by the controller 10 and is used to select the first bit of the data word to be read out of the storage array 21.

FIG. 9B is a block diagram of that portion of the prior art controller circuit used to transfer data from the read circuits shown in FIG. 9A to the controller logic circuits 12. This portion of the controller 10, as shown in FIG. 9B, comprises a plurality of identical circuits 218*a* and 218*b* equal to the number of read circuits in FIG. 9A. FIG. 9B shows, in block diagram form, the improved controller read transfer circuits 218*a* and 218*b* of the present invention together with the portion 223*a* of an improved strobe circuit 223 designed for use with a system employing the newer, faster DDR DRAMs. It should be understood that the present invention will also operate with the older, slower DDR DRAMs.

In the following description of the present invention it is to be noted that all the circuits in the controller read transfer circuit block 218 are identical to one another and substantially identical to those shown in FIG. 6A. Therefore, because the read transfer circuit 218*a* is identical to the read transfer circuit 218*b*, only the read transfer circuit 218 will be described in any detail and those elements in the read transfer circuits in this FIG. 9B that are identical to those used in the write circuit element shown in FIG. 6A will be identified by the same numbers as used in FIG. 6A.

The read transfer circuit 218*a* comprises a data line receiver 30, coupled to a respective one of the plurality of data lines in the data bus 17, through a data buffer circuit 131, and a multi-latch circuit 33, to the storage array 21. The data buffer circuit 131 of the circuit read transfer 218*a* is also coupled to a strobe generator 149, via a one shot circuit 142*a*. The circuit read transfer 218*b* is similarly coupled to the strobe generator 149 via one shot circuit 142*b*. Portion 223*a* of strobe circuit 223 comprises a receiver 140 coupled to the controller 10, via strobe signal line 22, and to a strobe buffer circuit 141 whose output is coupled through a delay circuit 132 and a a one shot circuit 143 to a strobe generator 149 whose outputs are coupled to the multi-latch circuit 33, in a manner identical to that shown in FIG. 6A,.

The strobe generator 149, shown in this FIG. 9B is also identical to that shown in FIG. 7 and is designed to operate in an identical manner.

It should be understood that if there are more than two read transfer circuits then each such read transfer circuit is would be coupled to the strobe generator 149 though a respective one shot circuit. That is, if there are sixteen read transfer circuits, each is coupled to the strobe generator 149 through a respective one shot circuit.

As one skilled in the art will readily understand, this circuit 9B operates in a manner substantially identical to the circuit shown in FIG. 6A in transferring data from the read circuits shown in FIG. 9*a* and the controller logic circuits 12 therefore is operation will not be described further.

With particular reference now to FIG. 10, together with continuing reference to FIG. 9A, the protocol used, by the present invention, to read data from the storage array 21 will be briefly described.

It will be assumed that the data stream to be read out of the array is comprised of the preamble and the four data words, (WORD 1, WORD2, WORD 3, and WORD 4) previously written into the array 21.

Initially both the system clock CK and the data delay clock DDL are both running as shown in FIG. 10. As can be seen from pulses 174*a*, 174*b*, 174*c*, 174*d* and 174*e*, the DDL clock is running at twice the speed of the system clock 14. When data is to be read out of the array 21, the strobe 123*b* is driven negative into its preamble mode simultaneously with the receipt of the DDL pulse 174b. The DDL pulse 174b also activates the multiplexor 61, the driver 63, the toggle 65, the initialize and enable circuit 64 and the compare circuit 80 and together with an external address feed signal AO sent from the controller 10, via line 16, activates the pointer 60 to select the first bit of the preamble word (WORD 0) in order to read the preamble word (WORD 0) out of the storage array 21 during the data eye 180. At the same time, the second bit in the preamble word is similarly transferred (read) by the read circuit 119b. All the bits forming the preamble word (WORD 0) are also fed to and held in the comparator circuit 80.

The first bit of the preamble is transferred, during the data eye 180 through the multiplexor 61, in read circuit 19a to the read data driver 63 from whence the bit is sent to the controller 10.

Because the toggle circuit 65 has been initialized by the initial and enable circuit 65 it is now toggled by each DDL clock pulse, to produce alternating "1"s and "0"s that are fed to the strobe driver 66 thereby setting it in condition to drive the first read data word (WORD 1) to the controller 10.

With the start of next DDL pulse 174c he next word in the data stream (WORD 1) is read, during data eye 181, from the array 21. As above all the bits forming this word (WORD 1) is also fed to the comparator circuit 80 where it is compared with the preamble word. Because the first data word (WORD 1) differs from the preamble word the comparator circuit holds the toggle 65 and prevents it from activating the global strobe DQS so that the strobe DQS remains negative and the second data word (WORD 2) is now read out of the array 21 during data eye 182.

With the first data word (WORD 1) read, the second data word (WORD 2) in the data stream, being different from the first data word (WORD 1), can be read out of the array 21 during the data eye 182 while maintaining the strobe DQS in its negative state. Subsequently, because the third data word (WORD 3) is identical to the previous data word (WORD 2) the strobe DQS must be driven positive so that the data word (WORD 3) can be read out during data eye 183.

The present invention thus relaxes the timing in aligning the strobe and the data word by causing the data bits to be self latching based on changes or transitions in the data word so that the data strobe need only be used when there are no data transitions and the data eye is very large. This permits the use of higher data transmission rates and correspondingly smaller data eyes.

This completes the description of the preferred embodiment of the invention. Since changes may be made in the above construction without departing from the scope of the invention described herein, it is intended that all the matter contained in the above description or shown in the accompanying drawings shall be interpreted in an illustrative and not in a limiting sense. Thus other alternatives and modifications will now become apparent to those skilled in the art without departing from the spirit and scope of the invention as set forth in the following claims.

What is claimed is:

1. A computer populated with a plurality of double data rate DRAMS including a controller, controller logic circuits, a system clock, and a memory containing a storage array, an internal clock, a data delay clock, a strobe circuit and a plurality of write and read circuits for writing data into and for reading data out of the storage array wherein:

each of said write circuits comprises a data receiver circuit, a write buffer circuit and a delay circuit coupled to said controller, via a first bus, for receiving data from said controller and writing said data, through a multi-latch circuit, into said storage array; and a write strobe circuit, including a strobe generator means having a multiplicity of inputs, each of said inputs being coupled to a respective one of a multiplicity of one shot circuits, a first one of said multiplicity of one shot circuits being coupled to a strobe receiver and each respective one of the remaining multiplicity of one shot circuits being coupled, to a write buffer in a respective one of said write circuits;

said strobe generator further having a plurality of outputs coupled to said multi-latch circuit.

2. The computer of claim 1 wherein said multi-latch circuit comprises first and second parallel paths with each path containing a plurality of serially arranged data bit latches.

3. The computer of claim 2 wherein said strobe generator contains means for combining the outputs of all the one shot circuits coupled thereto to create a single output pulse based on the state of all the individual pulses received and alternately sending said single output pulse to a pair of said data bit latches in said first parallel path and to a data bit latch in said second parallel path.

4. The computer of claim 1 wherein said strobe generator includes a strobe generator latch, formed of a pair of cross coupled NOR circuits having a common output coupled to a first input of an OR circuit said OR circuit having additional inputs, each of said additional inputs being coupled to a respective one of said multiplicity of one shot circuits;

said OR circuit further having an output coupled to a toggle and a 1–2 DeMux circuit.

5. The computer of claim 3 wherein said strobe generator latch comprises first and second cross-coupled NOR circuits;

the first one of said NOR circuits being is a two input NOR having a first input coupled to the strobe driven one shot circuit, a second input coupled to the output of the second NOR circuit and an output coupled to a first input of the second one of said NOR circuits;

said second NOR circuit further having, in addition to said first input, a multiplicity of additional inputs equal to the number of one shot circuits coupled thereto, each of one of said multiplicity of additional inputs being coupled to the output of a respective one of the write one shot circuits, and an output coupled to said second input of said first NOR circuit and to an input of an OR circuit.

6. The computer of claim 1 wherein each of said read circuits is comprised of a pointer circuit for selecting the data to be read out of a storage array, a multiplexor circuit, a read driver circuit for delivering the read data to the controller via said first bus and a read strobe circuit comprised of a initialize and enable circuit, a toggle circuit, a data compare circuit and a driver circuit coupled to the controller.

7. The computer of claim 6 wherein said pointer circuit has a pair of inputs, the first being coupled to a data delay clock, and the second being coupled to an external address feed from the controller;

said data delay clock being further to the initial and enable circuit, the toggle circuit and the data compare circuit;

the external address feed being provided by the controller to select the first bit of the data word to be read out of the storage array.

8. The computer of claim 1 wherein the controller circuit includes a plurality of sets of data transfer circuits;

a first set of transfer circuits, for transferring data from a set of controller logic circuits to said write circuits, coupled to a first strobe circuit;

a second set of transfer circuits, for transferring data out of said read circuits to said set of controller logic circuits, coupled to a second strobe circuit;

each data transfer circuit in said first set of data transfer circuits comprising; a pointer circuit, designed to activate those logic circuits that are receiving the data to be written into the write circuits; a multiplexor circuit coupled to said set of controller logic circuits, and a first data driver circuit coupled to said multiplexor circuit and coupled via said first bus to said write circuits;

said first strobe circuit coupled to said set of controller logic circuits comprising an initialize and enable circuit, a toggle circuit and a first strobe driver circuit; coupled to write circuits via a second bus; and a data delay clock connected to said strobe, said multiplexor circuit and said first driver circuit; and said pointer circuit;

each data transfer circuit in said second set of data transfer circuits comprising a first data bus coupled through a buffer circuit, and a multi-latch circuit, containing a plurality of individual latches to the controller logic;

a strobe circuit comprises a strobe receiver coupled to the read circuits via a second strobe signal line;

said second strobe signal line being further coupled through a strobe buffer circuit, a delay circuit and a one shot circuit, designed to detect both the leading or rising edge and the trailing or falling edge of any strobe signal introduced thereto to a strobe generator to various respective latches in the multi-latch circuit;

the multi-latch circuit being comprised of first, second, third, fourth and fifth individual data bit latches, each of said data bit latches having respective first and second inputs and a single output and being are inter-coupled to even out any mismatches or errors during the transfer of the data to the storage array.

9. The computer of claim 8 wherein the first, second and third latches are serially arranged in a first path and said fourth and fifth latch are serially arranged in a second path in parallel with said first path;

said first and fourth latches have their first inputs coupled in common to the output said first bus and said first latch has its second input connected to a first output of said strobe generator;

said second and said fourth latches have their second inputs coupled in common to a second output of said strobe generator; and said third and fifth latches have their second inputs coupled in common to said internal clock.

10. A process for operating a computer populated with a plurality of DRAMS including a system clock, a controller containing a strobe circuit including a strobe generator therein, and a plurality of read and write transfer circuits, and a memory containing a storage array, an internal clock, a data delay clock, a plurality of write circuits, for writing data into the storage array via a data bus, and a plurality of read circuits for reading data out of the storage array via said data bus, Said read and write circuits being coupled to said strobe circuit, comprising the steps of:

providing a preamble pulse to said data bus to set said bus at a selected voltage level and providing a preamble data word;

comparing, in said strobe generator, any differences between the data bits in a first data word being written into said storage array and the data bits in the preamble word and generating, in said strobe generator, a local latching strobe to latch the incoming data word when a difference is found between the data bits in the first data word being written into said storage array and the data bits in the preamble word and maintaining the state of said data bus when no differences between the first data word being written in to said storage array and the data bits in the preamble word are detected;

comparing, in said strobe generator, any differences between the data bits in subsequent data word being written into said storage array and the data bits in the immediately preceding word written into the storage array and generating, in said strobe generator, a local latching strobe to latch the incoming data word when a difference is found between the data bits in a data word being written into said storage array and the data bits in the immediately preceding word written in to said storage array and maintaining the state of said data bus when no differences between the data word being written into said storage array and the data bits in the immediately preceding word are detected; and producing, in said strobe generator, a global strobe pulse only when no differences exist between the data bits in a first data word being read out of said storage array and the data bits in the preamble word or when no differences exist between the data bits in the first data word being written into said storage array and the data bits in the immediately preceding word thereby providing a higher data transfer rate.

* * * * *